(12) United States Patent
Saji et al.

(10) Patent No.: US 8,735,732 B2
(45) Date of Patent: May 27, 2014

(54) MULTILAYER SUBSTRATE

(75) Inventors: Tetsuo Saji, Kanagawa (JP); Gohki Nishimura, Kanagawa (JP); Naoyuki Tasaka, Kanagawa (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 68 days.

(21) Appl. No.: 13/331,306

(22) Filed: Dec. 20, 2011

(65) Prior Publication Data

US 2012/0300416 A1 Nov. 29, 2012

(30) Foreign Application Priority Data

May 27, 2011 (JP) ................. 2011-119512
Oct. 24, 2011 (JP) ................. 2011-233277

(51) Int. Cl.
*H05K 1/16* (2006.01)
*H05K 1/03* (2006.01)

(52) U.S. Cl.
USPC ............ 174/255; 361/794; 174/260; 174/262

(58) Field of Classification Search
USPC .......... 174/260, 262–266, 255; 361/792–795
See application file for complete search history.

(56) References Cited

U.S. PATENT DOCUMENTS

| | | | | |
|---|---|---|---|---|
| 6,323,439 | B1 * | 11/2001 | Kambe et al. | 174/262 |
| 7,738,256 | B2 * | 6/2010 | Sawatari et al. | 361/761 |
| 2002/0136873 | A1 | 9/2002 | Li et al. | |
| 2005/0176380 | A1 | 8/2005 | Okabe et al. | |
| 2007/0080447 | A1 | 4/2007 | Hasebe et al. | |
| 2007/0164401 | A1 | 7/2007 | Higuchi | |
| 2009/0084596 | A1 | 4/2009 | Inoue et al. | |
| 2009/0237178 | A1 | 9/2009 | Lee et al. | |

FOREIGN PATENT DOCUMENTS

| | | |
|---|---|---|
| JP | 2001-274034 A | 10/2001 |
| JP | 2004-31732 A | 1/2004 |
| JP | 2006-74014 A | 3/2006 |
| JP | 2007-174075 A | 7/2007 |
| JP | 2007-189152 A | 7/2007 |
| JP | 2009-81423 A | 4/2009 |
| TW | 200537993 A | 11/2005 |
| TW | 200941933 A | 10/2009 |

OTHER PUBLICATIONS

Search Report under Section 17 dated Jul. 6, 2012, in a counterpart GB patent application No. 1121453.3.
Japanese Office Action issued on Nov. 9, 2012, in a counterpart Japanese patent application No. 2011-233277.
Taiwanese Office Action issued on Aug. 28, 2013, in a counterpart Taiwanese patent application No. 100146946.

* cited by examiner

*Primary Examiner* — Jeremy C Norris
(74) *Attorney, Agent, or Firm* — Chen Yoshimura LLP (57) ABSTRACT

A multilayer substrate is configured by stacking conductive layers and insulation layers. The multilayer substrate includes a core that is one of the conductive layers and is thicker than any of other conductive layers, and a first signal line that is included in the conductive layers and is adjacent to the core so that a first insulation layer that is one of the insulation layers is interposed between the core and the first signal line, the first signal line being used for transmission of an RF signal. The core has a recess portion so as to face the first signal line.

22 Claims, 8 Drawing Sheets

MULTILAYER SUBSTRATE

CROSS-REFERENCE TO RELATED APPLICATIONS

This application is based upon and claims the benefit of priority of the prior Japanese Patent Application No. 2011-119512 filed on May 27, 2011, the entire contents of which are incorporated herein by reference. Further, the application is based upon the prior Japanese Patent Application No. 2011-233277 filed on Oct. 24, 2011, the entire contents thereof are incorporated herein by reference.

FIELD

A certain aspect of the present invention relates to multi-layer substrates.

BACKGROUND

Communication devices such as portable phones are being developed so as to work on multiple bands. In order to cope with multi-band working, one portable phone is equipped with RF devices that handles multiple RF signals such as filters, duplexers and amplifiers. It is desired to realize a compact module on which the RF devices are integrated in order to downsize the portable phones.

Such a compact module may use a multilayer substrate formed by stacking multiple insulation layers and multiple conductive layers. The characteristic impedance of a signal line included in a conductive layer depends on, for example the distance between related conductive layers and the dielectric constant of the insulation layer interposed between the conductive layers. For example, Japanese Patent Application Publication 2007-189152 (Document 1) discloses an art having a core of a dielectric, a ground layer that is provided between a signal layer and an outer layer and has an opening, and another ground layer that is provided in the conductive layer in which a signal layer is also provided. In this art, the characteristic impedance of the signal line depends on the distances between the outer layer and the ground layers. Japanese Patent Application Publication No. 2009-81423 (Document 2) discloses a multilayer substrate having a metal core having an opening in which an electronic component is accommodated.

In the art disclosed in Document 1, a signal interference may occur between the signal layer and the outer layer via the opening formed in the ground layer. In the art disclosed in Document 2, it may be difficult to realize both a thinned multilayer substrate and a desired characteristic impedance of the signal line.

SUMMARY OF THE INVENTION

According to an aspect of the present invention, there is provided a multilayer substrate configured so that conductive layers and insulation layers are stacked, the multilayer substrate including: a core that is one of the conductive layers and is thicker than any of other conductive layers; and a first signal line that is included in the conductive layers and is adjacent to the core so that a first insulation layer that is one of the insulation layers is interposed between the core and the first signal line, the first signal line being used for transmission of an RF signal, the core having a recess portion so as to face the first signal line.

DETAILED DESCRIPTION

Figure 1A:
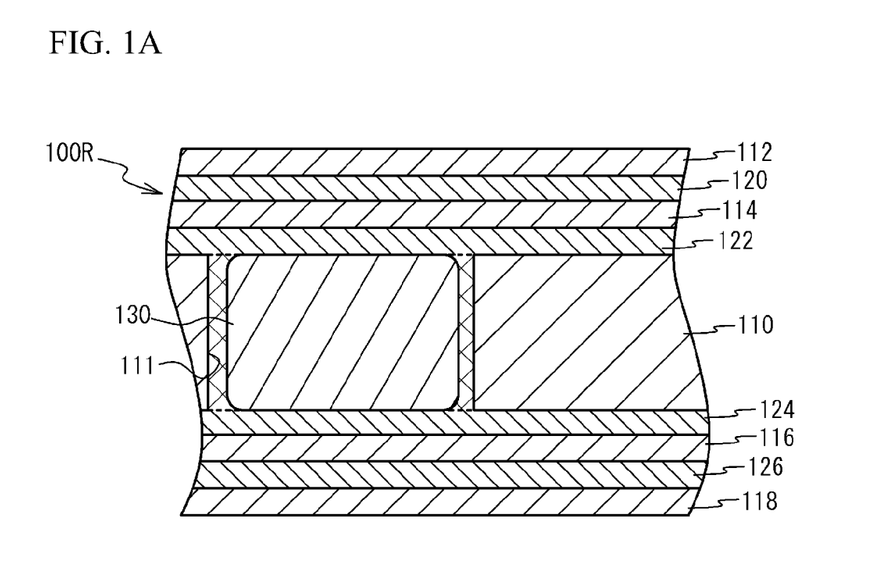
FIG. 1A is a cross-sectional view of a multilayer substrate in accordance with a comparative example 1.

Now, two comparative examples 1 and 2 are described. The comparative examples 1 and 2 use a core made of a metal. FIG. 1A is a cross-sectional view of a multilayer substrate in accordance with the comparative example 1.

Referring to FIG. 1A, a multilayer substrate 100R is composed of conductive layers 112~118, insulation layers 120~126, and an electronic component 130. The conductive layer 112 is located on the upper surface of the multilayer substrate 100R. The insulation layer 120 is provided below the conductive layer 112. The conductive layer 114 is provided below the insulation layer 120. The insulation layer 122 is provided below the conductive layer 114. The core 110 is provided below the insulation layer 122. A cavity 111 is provided in the core 110. The electronic component 130 is accommodated in the cavity 111. The electronic component 130 may be accommodated so that the whole of the electronic component 130 or a part thereof is in the cavity 111. That is, at least part of the electronic component 130 is accommodated in the cavity 111. Both sides of the core 110 (left and right sides in FIG. 1A) face an opening or an insulation layer. A rear side of the core 110 connecting the opposite sides is illustrated by cross lines. The insulation layer 124 is provided below the core 110. The conductive layer 116 is provided below the insulation layer 124. The insulation layer 126 is provided below the conductive layer 116. The conductive layer 118 is provided below the insulation layer 126 and is located on the lower surface of the multilayer substrate 100R.

The core 110 and the conductive layers 112~118 are made of a metal such as copper (Cu). The insulation layers 120~126 are made of resin such as glass epoxy resin or an insulator other than resin. The electronic component 130 may be a passive component such as a filter, a capacitor or an inductor, or an active component such as an IC. The thickness of the core 110 is equal to or larger than the thickness of the electronic component 130.

The conductive layer 114 includes a signal line over which an RF signal is transmitted, and a ground layer. The core 110 and the conductive layer 112 are used as ground layer. The conductive layers 116 and 118 are used as signal lines over which signals other than the RF signal are transmitted, or ground layers. The RF signal may be a microwave signal, for example. The RF signal may include signals having frequencies of GHz bands corresponding to W-CDMA (Wideband Code Division Multiple Access), signals having frequencies of hundreds of MHz corresponding to GSM (Global System for Mobile Communications) and signals of hundreds of MHz corresponding to WCDMA. The signals other than the RF signal includes signals having frequencies ranging from, for example, a few Hz to tens of MHz, and direct current.

Since the core 110 functions as a ground layer, it is possible to suppress signal interference between the conductive layer 114 and the conductive layer 116 and that between the conductive layer 114 and the conductive layer 118. The core 110 functions as a shield that isolates the electronic component 130 from noise. The core 110 is thicker than each of the conductive layers 112~118. Since the core 110 is made of a metal and is relatively thick, the strength of the multilayer substrate 100R is enhanced, as compared to a case where the core 110 is made of an insulator. Since the core 110 has good heat transfer performance, heat generated by the electronic component 130 is effectively transferred to the outside. The use of the core 110 made of a metal realizes suppression of signal interference and improved strength and heat transfer performance.

Figure 1B:
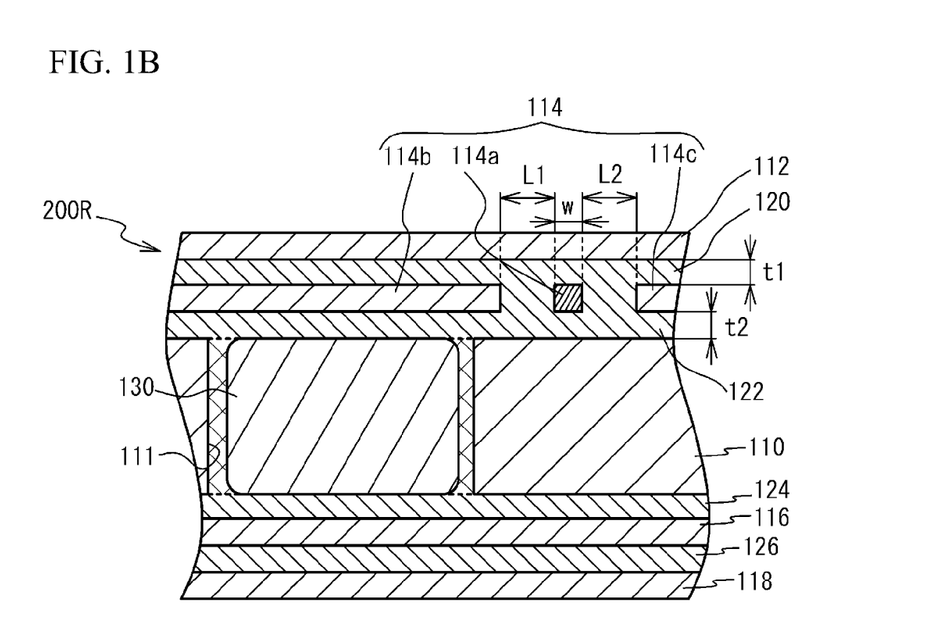
FIG. 1B is a cross-sectional view of a multilayer substrate in accordance with a comparative example 2.

The core 110, the conductive layer 112 and the conductive layer 114 may form a strip line, which is a kind of transmission line. FIG. 1B is a cross-sectional view of an exemplary multilayer substrate having a strip line.

Referring to FIG. 1B, the conductor 114 of a multilayer substrate 200R includes a signal line 114a, a ground layer 114b and a ground layer 114c. The ground layers 114b and 114c are provided at both sides of the signal line 114a and are spaced apart from the signal line 114 a. An insulation layer, which is made of the same insulator as that of the insulation layer 120 is provided between the signal line 114a and the ground layer 114b and between the signal line 114a and the ground layer 114c. The core 110 and the conductive layers 112 and 114 form a strip line and have a predetermined characteristic impedance. The signal line 114a functions as a line through which an RF signal flows. Strictly, a return current flows through the core 110 and the conductive layers 112 and 114.

The characteristic impedance of the strip line mainly depends on the dimensions of the layers that form the strip line, and the dielectric constants of the insulation layers. The dimensions include the thickness t1 of the insulation layer 120, the thickness t2 of the insulation layer 122, and the width w of the signal line 114a. The thickness t1 is equal to the distance between the conductive layer 112 and the conductive layer 114. The thickness t2 is equal to the distance between the conductive layer 114 and the core 110. In a case where t1 or t2 is small and w is large, the characteristic impedance is low. In a case where t1 or t2 is large and w is small, the characteristic impedance is high. Although the characteristic impedance depends on the thickness of the conductive layer, the thickness of the conductive layer is ignored for the sake of simplicity of the description.

The multiple substrate may be mounted on a portable phone or the like. For the purpose of downsizing the portable phone, the multilayer substrates 100R and 200R should be thinned. This may be achieved by reducing the thicknesses t1 and t2. However, reduced thicknesses t1 and t2 decrease the characteristic impedance. In order to keep the characteristic impedance equal to a predetermined value, which may be 50 Ω, for example, the width w of the signal line 114a may be reduced. The characteristic impedance is influenced by the distance between the conductors. Thus, the distance L1 between the signal line 114a and the ground layer 114b and the distance L2 between the signal line 114a and the ground layer 114c may affect the characteristic impedance. In a case where the distances L1 and L2 are small, the characteristic impedance is low. In order to increase the characteristic impedance, it is preferable to reduce the influence of the ground layers 114b and 114c to the characteristic impedance. It is thus preferable that the distances L1 and L2 are twice the width of the signal line 114a or more (L1, L2≥2 w).

As described above, a reduction in the line width w may realize a desired value of the characteristic impedance. However, if the line width w is too small, it may be difficult to achieve a satisfactory quality of the signal line 114a. For example, in a case where the thicknesses t1 and t2 of the insulation layers 120 and 122 are 25 μm, and the dielectric constants thereof are 3.4, and where the core 110 and each of the conductive layers are made of copper, a characteristic impedance of 50 Ω is realized by setting the line width w equal to 17 μm. However, it is difficult to form the signal line 114a as narrow as 17 μm. In contrast, the signal line 114a as wide as, for example, 30 μm is formed easily, but the characteristic impedance of the strip line is 40 Ω, which deviates from the desired value.

As described, when the core is made of a metal, it may be difficult to realize both a thinned multilayer substrate and a desired characteristic impedance. Now, a description is given of embodiments of the present invention with reference to the accompanying drawings.

Embodiment 1

Figure 2:
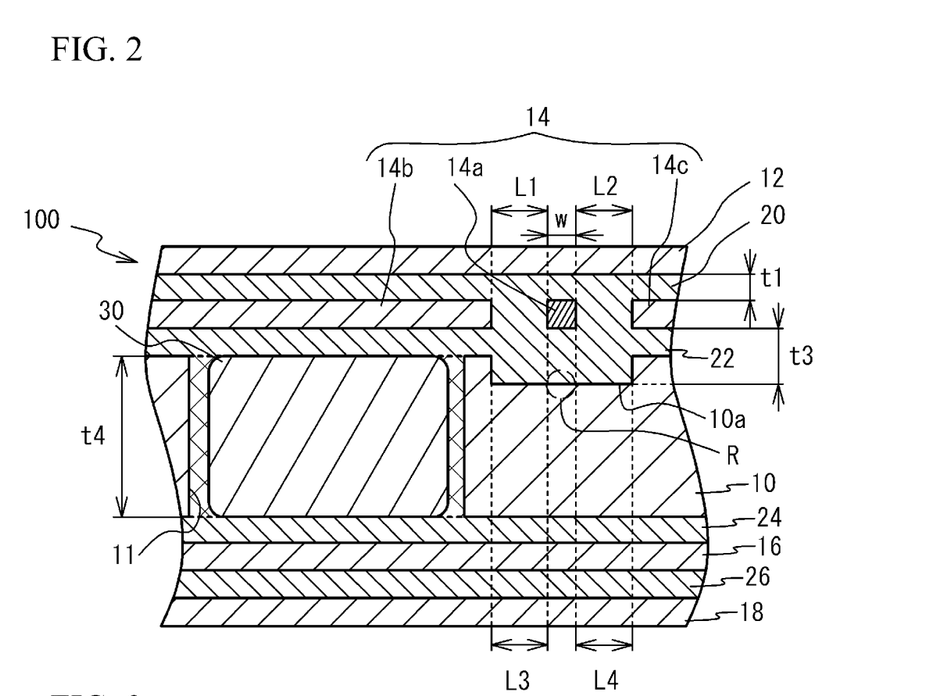
FIG. 2 is a cross-sectional view of a multilayer substrate in accordance with an embodiment 1.

FIG. 2 is a cross-sectional view of an exemplary multilayer substrate in accordance with an embodiment 1. In FIG. 2, parts that are the same as those illustrated in FIGS. 1A and 1B are given the same reference numerals.

As illustrated in FIG. 2, a multilayer substrate 100 includes a core 10, conductive layers 12~18, insulation layers 20~26 and the electronic component 30. The multilayer substrate 100 is composed of multiple conductors having the core 10 and multiple insulation layers, which layers are vertically stacked.

The core 10 is thicker than the other conductive layers. The conductive layer 14 is adjacent to the core 10 so that the insulation layer (first insulation layer) 22 is interposed therebetween. The conductive layer 14 includes a signal line 14a (first signal line), and ground layers 14b and 14c (second ground layers). The ground layers 14b and 14c are conductive layers located on the same plane as the signal line 14a. The signal line 14a is a conductive line through which the RF signal is transmitted. The core 10 has a through hole 11 in which the electronic component 30 is accommodated. A recess portion 10a is formed on a surface of the core 10 that faces the signal line 14a.

The conductive layer 12 is provided at the side of the signal line 14a opposite to the side thereof at which the core 10 is provided, and is a ground layer (first ground layer) adjacent to the signal line 14a through the insulation layer 20 (second insulation layer). The conductive layers 16 and 18 are located at the side of the core 10 opposite to the side thereof at which the signal line 14a is provided. The conductive layers 16 and 18 include a line (a second signal line) through which a signal other than the RF signals is transmitted.

The recess portion 10a is formed on the surface of the core 10 that faces the signal line 14a. The thickness t3 of the insulation layer 22 on the recess portion 10a, that is, the distance between the signal line 14a and the bottom of the recess portion 10a is larger than the thickness t2 of the insulation layer 122 illustrated in FIG. 1B. The core 10, the conductive layers 12 and 14, and the insulation layers 20 and 22 form a strip line. As described previously, as the thickness of the insulation layer increases, the characteristic impedance increases. The presence of the recess portion 10a increases the thickness t3 of the insulation layer 22 between the recess portion 10a and the signal line 14a. Thus, the embodiment 1 has an increased characteristic impedance. By changing the thicknesses t1 and t3, it is possible to easily obtain a desired characteristic impedance. As described above, the multilayer substrate 100 is thinned and the line width w is set to a producible value, nevertheless the characteristic impedance can be increased due to the presence of the recess portion 10a. It is thus possible to realize both thinning and a desired characteristic impedance. The core 10 made of a metal is interposed between the signal line 14a and the conductive layer 16 and between the signal line 14a and the conductive layer 18. It is thus possible to suppress the interference between the signal that is transmitted through the signal line 14a and the signal that is transmitted through the conductive layer 16 and the interference between the signal that is transmitted through the signal line 14a and the signal that is transmitted through the conductive layer 18.

In order to effectively secure the characteristic impedance, it is preferable to reduce the influence of the ground layers 14b and 14c to the characteristic impedance. It is thus preferable that the distances L1 and L2 are large. The distances L1 and L2 may be twice the line width 2, or 2 w, or more. It is preferable to reduce an influence to the characteristic impedance from an area other than the recess portion 10a of the core 10. Thus, it is preferable to have a large distance L3 between an area R define by vertically projecting a portion of the signal line 14a surrounded by a broken line onto the core 10 and one of the opposite side surfaces of the recess portion 10a in the cross section and a large distance L4 between the area R and the other side surface of the recess portion 10a. The distances L3 and L4 may be equal to or greater than 2 w.

Figure 3:
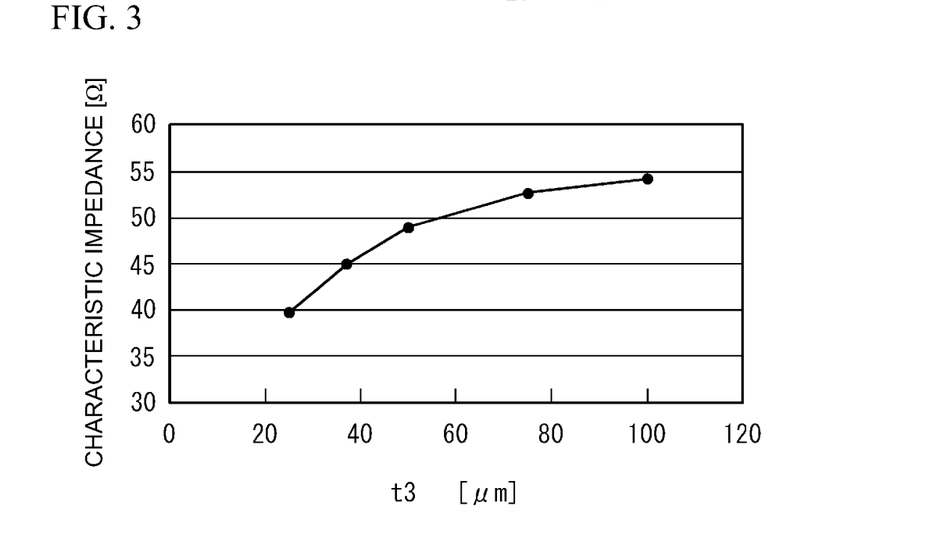
FIG. 3 is a diagram that illustrates results of calculation of the multilayer substrate of the embodiment 1.

A calculation of the characteristic impedance is now described. The multilayer substrate 100 illustrated in FIG. 2 was used as a sample, and the characteristic impedance of the sample was measured while the thickness t3 was changed. The conditions for the calculation are as follows.

t1: 25 μm (t1 is the thickness of the insulation layer 20)
t4: 150 μm (t4 is the thickness of the core 10)
w: 30 μm (w is the line width of the signal line 14a)
L1, L2, L3, L4: 60 μm (L1~L4 are distances)
dielectric constants of the insulation layers 20~26:3.4
materials of the core 10 and conductive layers 12~18: copper FIG. 3 is a diagram illustrating results of calculation of the characteristic impedance of the multilayer substrate in accordance with the embodiment 1. The horizontal axis denotes the thickness t3, and the vertical axis denotes the characteristic impedance.

As illustrated in FIG. 3, as the thickness t3 becomes larger, the characteristic impedance becomes higher. When the thickness t3 is nearly equal to 60 μm, the characteristic impedance is 50 Ω. When t3 is nearly equal to 100 μm, the characteristic impedance is close to 55 Ω. By setting t3 approximately equal to 37.5~75 μm (1.5~3 times the thickness t1), for example, it is possible to obtain a desired characteristic impedance.

The thickness of the core 10 is approximately 120 μm even when the recess portion 10a is provided under the above-described conditions. Hence, the heat transfer performance and the mechanical strength are highly maintained. The recess portion 10a may be defined by providing resist on the core 10 except for an area in which the recess portion 10a is to be formed and performing half etching.

Figure 4A:
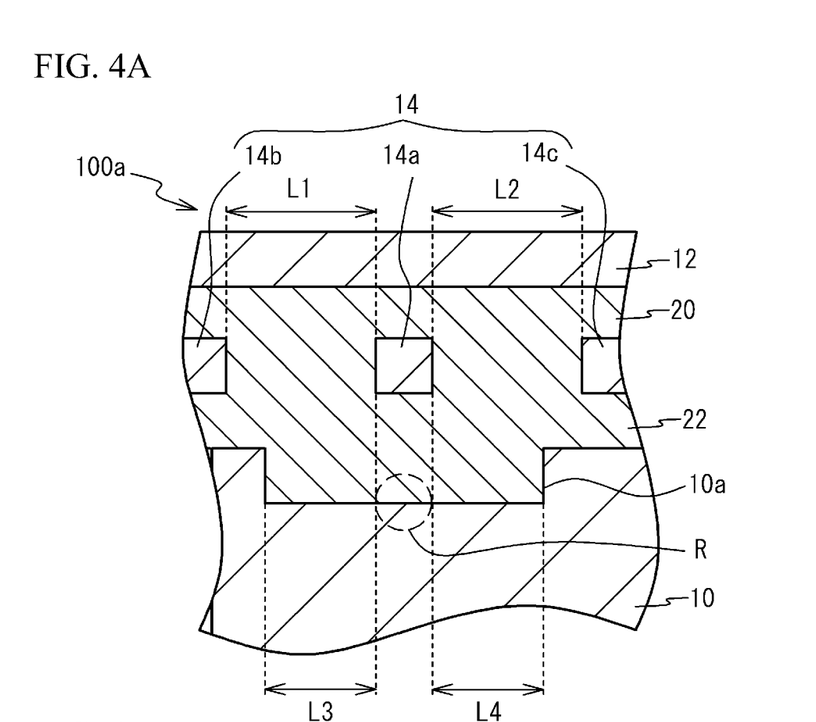
FIG. 4A is a cross-sectional view of a multilayer substrate in accordance with a first variation of the embodiment 1.

Now, a variation of the embodiment 1 is described. FIG. 4A is a cross-sectional view of an exemplary multilayer substrate in accordance with a first variation of the embodiment 1.

Referring to FIG. 4A, a multilayer substrate 100a is configured so that the distance L1 between the signal line 14a and the ground layer 14b and the distance L2 between the signal line 14a and the ground layer 14c are larger than the distances L3 and L4, respectively. It is thus possible to reduce the influences of the ground layers 14b and 14c to the characteristic impedance and to obtain a desired characteristic impedance easily. The ground layers 14b and 14c provided at both sides of the signal line 14a may be replaced by signal lines through which any signal other than the RF signal is transmitted. Like this example, the conductive layer 14 may include lines other than the signal line 14a. By increasing the distances L1 and L2, it is possible to suppress signal interference.

Figure 4B:
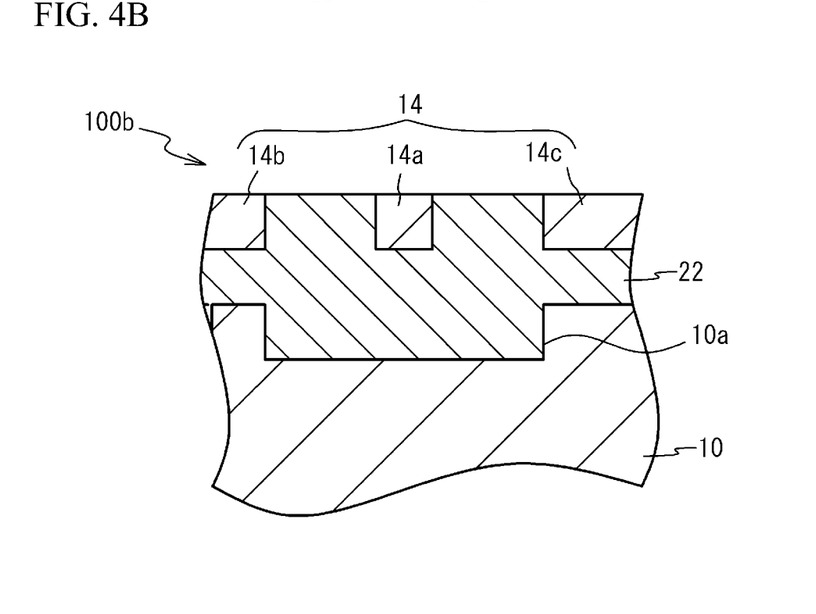
FIG. 4B is a cross-sectional view of a multilayer substrate in accordance with a second variation of the embodiment 1.

FIG. 4B is a cross-sectional view of a multilayer substrate in accordance with a second variation of the embodiment 1. As illustrated in FIG. 4B, a multilayer substrate 100b does not include the conductive layer 12 and the insulation layer 20. In other words, the conductive layer 14 is located on the upper surface of the multilayer substrate 100b. The signal line 14a, the ground layers 14b and 14c and the core 10 form a microstrip line, which is a kind of transmission line. The recess portion 10a is formed in the core 10. Thus, like the embodiment 1, it is possible to realize a desired characteristic impedance of the microstrip line.

Embodiment 2

Figure 5:
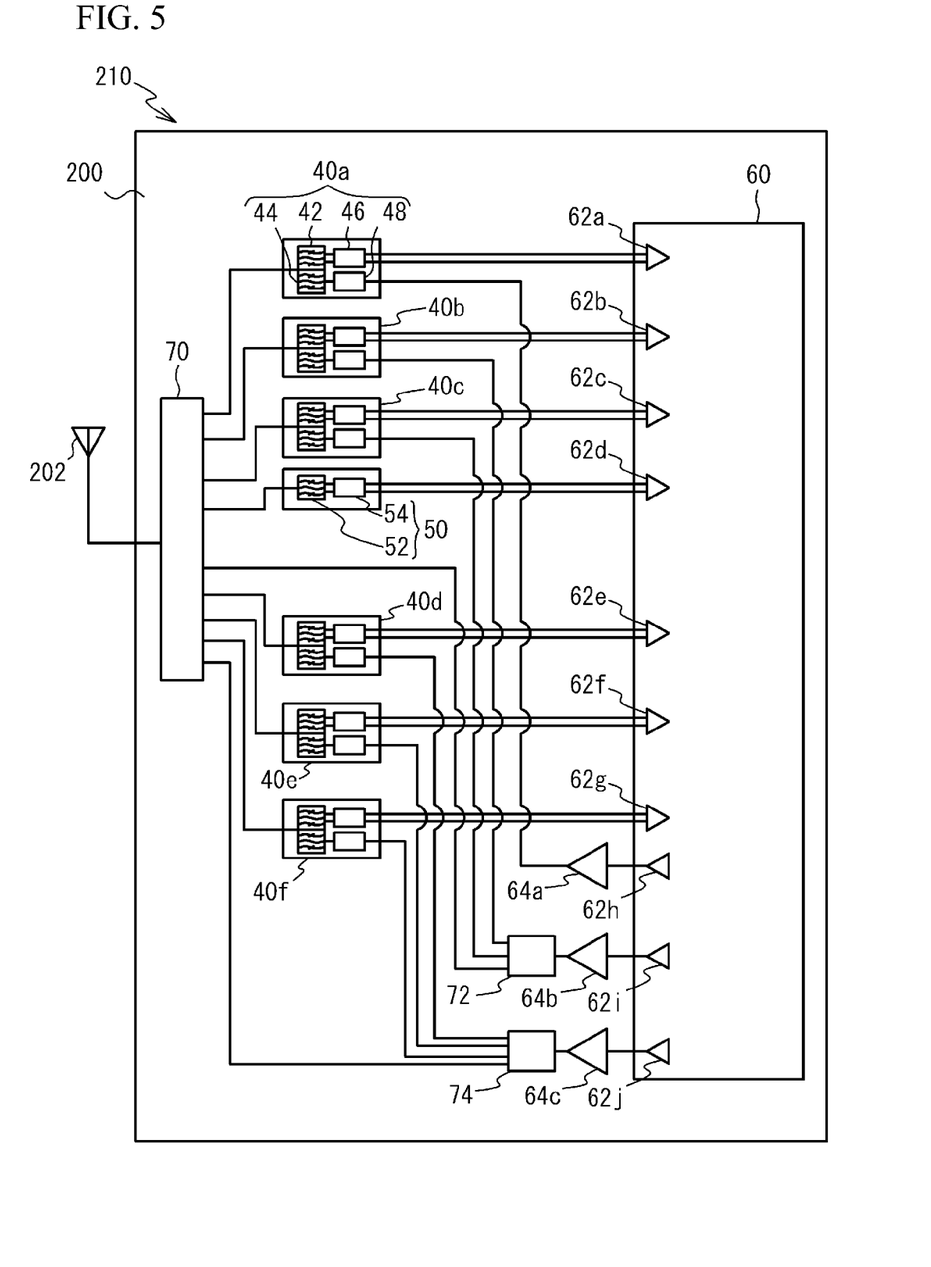
FIG. 5 is a block diagram of a module that employs a multilayer substrate in accordance with an embodiment 2.

An embodiment 2 is an exemplary module substrate. FIG. 5 is a block diagram of a multilayer substrate in accordance with the embodiment 2.

As illustrated in FIG. 5, a multilayer substrate 100 includes duplexers 40a~40f, a filter circuit 50, an IC (Integrated Circuit) 60, power amplifiers 64a~64c, and switches 70~74. The multilayer substrate 200 is a module substrate used for an RF module 210. The duplexer 40a includes a reception filter 42, a transmission filter 44, a matching circuit 46 and a matching circuit 48. Balanced output terminals of the reception filter 42 are connected to the matching circuit 46. An unbalanced input terminal of the transmission filter 44 is connected to the matching circuit 48. Each of the duplexers 40b~40f has a configuration similar to that of the duplexer 40a. The filter circuit 50 includes a filter 52 and a matching circuit 54. Balanced output terminals of the filter 52 are connected to the matching circuit 54. The IC 60 includes LNAs (Low Noise Amplifier) 62h~62j. The IC 60 functions as a direct conversion transceiver that performs a frequency conversion.

The switch 70 is connected to an antenna 202, the duplexers 40a~40f, the filter circuit 50, and the switches 72 and 74. The common terminal of the reception filter 42 and the transmission filter 44 are connected to the antenna 202 via the switch 70. The balanced output terminals of the duplexer 40a, are connected to the LNA 62a via the matching circuit 46. The unbalanced output terminal of the duplexer 40a is connected to the output terminal of the power amplifier 64a via the matching circuit 48.

The balanced output terminals of the duplexer 40b are connected to the input terminals of the LNA 62b. The unbalanced input terminal of the duplexer 40b is connected to the switch 72. The balanced output terminals of the duplexer 40c are connected to the input terminals of the LNA 62a. The unbalanced input terminal of the duplexer 40c is connected to the switch 72. The balanced output terminals of the filter circuit 50, that is, the balanced output terminals of the duplexer 40*d* are connected to the input terminals of the LNA 62*d*. The balanced output terminals of the duplexer 40*d* are connected to the input terminals of the LNA 62*e*. The unbalanced input terminal of the duplexer 40*d* is connected to the switch 74. The balanced output terminals of the duplexer 40*e* are connected to the input terminals of the LNA 62*f*. The unbalanced input terminal of the duplexer 40*e* is connected to the switch 74. The balanced output terminals of the duplexer 40*f* are connected to the input terminals of the LNA 62*g*. The unbalanced input terminal of the duplexer 40*f* is connected to the switch 74.

The input terminal of the power amplifier 64*a* is connected to the output terminal of the VGA 62*h*. The switch 72 is connected to the output terminal of the power amplifier 64*b*. The input terminal of the power amplifier 64*b* is connected to the output terminal of the VGA 62*i*. The switch 74 is connected to the output terminal of the power amplifier 64*c*. The input terminal of the power amplifier 64*c* is connected to the output terminal of the VGA 62*j*.

The antenna 202 receives and transmits RF signals. The duplexers 40*a*~40*f* correspond to different bands. In accordance with the communication system and band to be used, the switch 70 selects any of the duplexers 40*a*~40*f*, the filter circuit 50, the switch 72 and the switch 74 and makes a connection with the antenna. The switch 72 selects any of the duplexer, 40*b*, the duplexer 40C and the switch 70 and makes a connection with the power amplifier 64*b*. The switch 74 selects any of the duplexers 40*d*~40*f* and the switch 70 and makes a connection with the power amplifier 64*c*.

A description is given of a case where the duplexer 40*a* and the antenna 202 are connected together. A reception signal received via the antenna 202 is input to the reception filter 42 of the duplexer 40*a*. The reception filter 42 filters the reception signal, and outputs the filtered signal to the LNA 62*a* via the matching circuit 46. The LNA 62*a* amplifiers the reception signal. The IC 60 down converts the reception signal, which is an RF signal input to the LNA 62*a*, into a baseband signal. The IC 60 up converts the transmission signal, which is a baseband signal, into an RF signal. The transmission signal obtained by up converting is amplified by the VGA 62*h* and the power amplifier 64*a*. The transmission signal thus amplified is input to the transmission filter 44 via the matching circuit 48. The transmission signal is output 202 after filtered.

The duplexers 40*b*~40*f* function like the duplexer 40*a*. The filter 52 included in the filter circuit 50 filters the reception signal. The reception signal is output to the LNA 62*d* via the matching circuit 54. The filters included in the duplexers 40*a*~40*f* and the filter circuit 50 may be acoustic wave filters such as SAW (Surface Acoustic Wave) filters, boundary acoustic wave filters or filters using FBARs (Film Bulk Acoustic Resonators).

Figure 6:
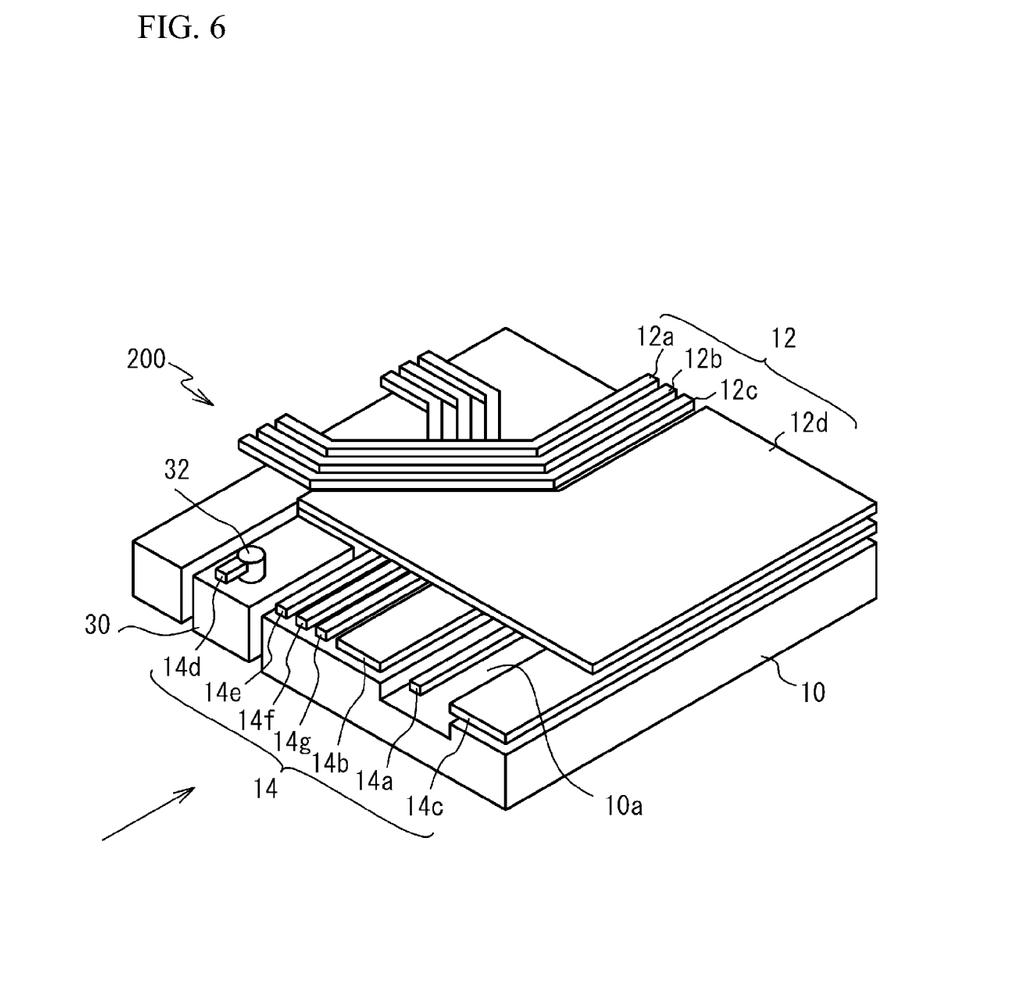
FIG. 6 is a perspective view of a multilayer substrate in accordance with the embodiment 2.
Figure 7A:
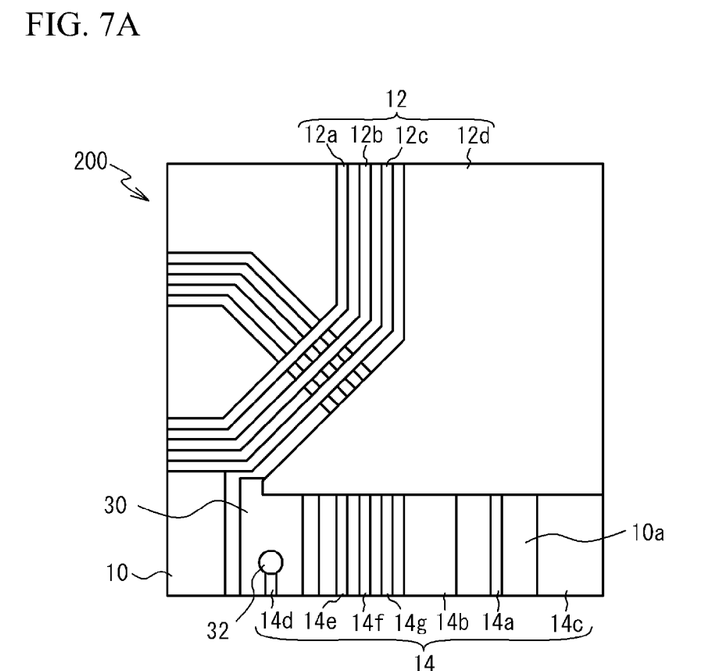
FIG. 7A is a plan view of the multilayer substrate of the embodiment 2.
Figure 7B:
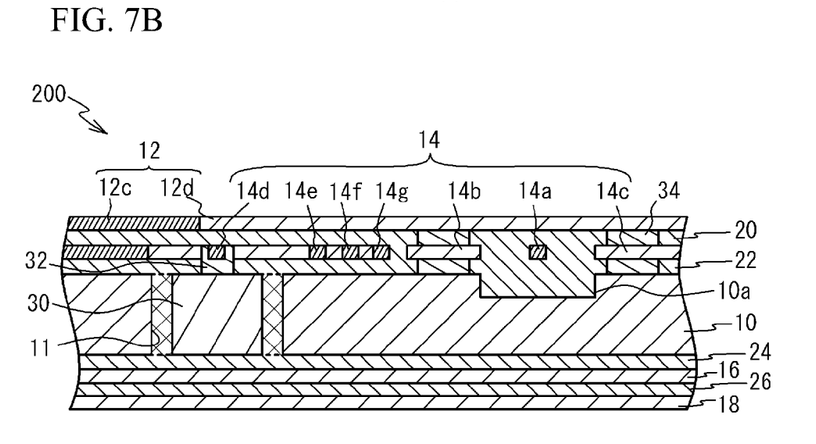
FIG. 7B is a cross-sectional view of the multilayer substrate of the embodiment 2.

A layer structure of the multilayer substrate 200 is described. FIG. 6 is a perspective view of the multilayer substrate 200 in accordance with the embodiment 2. FIG. 7A is a plan view of the multilayer substrate 200 in accordance with the embodiment 2, and FIG. 7B is a cross-sectional view of the multilayer substrate 200. In FIGS. 6 and 7A, the internal structure of the multilayer substrate 200 is illustrated so as to remove a part of the ground layer 12*d* and are seen through the insulation layers 20~26. FIG. 7B illustrates a cross section seen in a direction indicated by an arrow in FIG. 6.

As illustrated in FIGS. 6, 7A and 7B, the multilayer substrate 200 includes the core 10, the conductive layers 12~18, the insulation layers 20~26, the electronic component 30, and via interconnections 32 and 34. The conductive layer 12 includes signal lines 12*a*~12*c* and a ground layer 12*d*. The conductive layer 14 includes a signal line 14*a*, ground layers 14*b* and 14*c*, and signal lines 14*d*~14*e*. The signal line 14*a* is used to transmit the RF signal. The signal lines 12*a*~12*c* and the signal lines 14*d*~14*g* are used to transmit signals other than the RF signal. The conductive layers 16 and 18 include lines for any signal. Like the embodiment 1, the recess portion 10*a* is provided in the area of the core 10 that faces the signal line 14*a*.

The via interconnection 32 is connected to the electronic component 30. The signal line 14*d* is connected to the via interconnection 32. The core 10 and the ground layers 14*b* and 12*d* are interconnected via the via interconnection 34. The core 10 and the ground layers 14*c* and 12*d* are interconnected via the via interconnection 34. The via interconnection 34 passes through, for example, the insulation layer 20 and/or the insulation layer 22.

According to the embodiment 2, like the embodiment 1, it is possible to provide the multilayer substrate 100 capable of suppressing the signal interference and realizing thinning and a desired characteristic impedance. The structure of the multilayer substrate 200 as illustrated in FIGS. 6, 7A and 7B is preferably provided between the IC 60 and each of the duplexers 40*a*~40*f* and between the IC 60 and the filter circuit 50 illustrated in FIG. 5. In other words, the strip line formed so as to include the core 10, the signal line 14*a*, the ground layer 12*d* and the ground layers 14*b* and 14*c* is used to make connections between the IC 60 and the duplexers 40*a*~40*f* and between the IC 60 and the filter circuit 50. The duplexers 40*a*~40*f* and the IC 60 may be mounted on or formed within the multilayer substrate. Balanced signals or unbalanced signals are transmitted through the above connections. One unbalanced signal is transmitted over one signal line 14*a* illustrated in FIG. 6. A pair of balanced signals is transmitted by using a differential strip line structure composed of the signal line 14*a* and another signal line adjacent to and spaced apart from the signal line 14*a*. It is thus possible to effectively reduce loss of the RF signal. The strip line may be provided to make connections between the antenna 202 and the switch 70, those between the switch 70 and each of the duplexers 40*a*~40*f* and the filter circuit 50, and/or those between the duplexers 40*a*~40*f* and the power amplifiers 64*a*~64*c*. The multilayer substrate 200 is suitably applied to sections in which the RF signals received or transmitted via the antenna 202 are not subjected to frequency conversion, that is, the sections between the antenna 202 and the IC 60. It is thus possible to reduce the loss of the RF signals.

The multilayer substrate may have one or a plurality of filters and/or one or a plurality of duplexers. It is to be noted that an RF module having multiple duplexers or filters as illustrated in FIG. 5 may have large wiring distances. The large wiring distances may increase the loss of signals, particularly, the loss of RF signals. Therefore, the multilayer substrate 200 is preferably used as a module substrate of an RF module having multiple duplexers or filters. In this case, the strip line formed by the core 10, and the signal lines 14*a*, 14*b* and 14*c* is connected to the multiple duplexers or filters. With this structure, it is possible to effectively reduce the loss of RF signals because of reduced distances between the parts built in the multilayer substrate. The multilayer substrate 200 may applied to modules other than the RF modules or electronic devices that handle RF signals.

In the embodiment 2, the conductive layer 14 includes the signal lines 14*d*~14*g*. In order to suppress the signal interference between the signal line 14*a* and each of the signal lines 14*d*~14*g*, it is preferable to reduce the distance between the signal line 14*a* and the ground layer 14*b* and the distance between the signal line 14*a* and the ground layer 14*c* as large as a decrease in the characteristic impedance is kept in a tolerable range. These distances may be equal to 2 w where w is the width of the signal line 14a or may be greater than 2 w as in the case of the example illustrated in FIG. 4A. In order to suppress the signal interference, it is preferable to increase the distance between the signal line 14a and each of the signal lines 14d~14f. Particularly, in a case where the ground layers 14b and 14c are not provided, it is preferable to increase the distance between the signal lines. The widths of the signal lines 14d~14f and those of the signal lines 12a~12c may be equal to or different from the width of the signal line 14a. The filters may be those other than the acoustic wave filters.

Embodiment 3

Figure 8A:
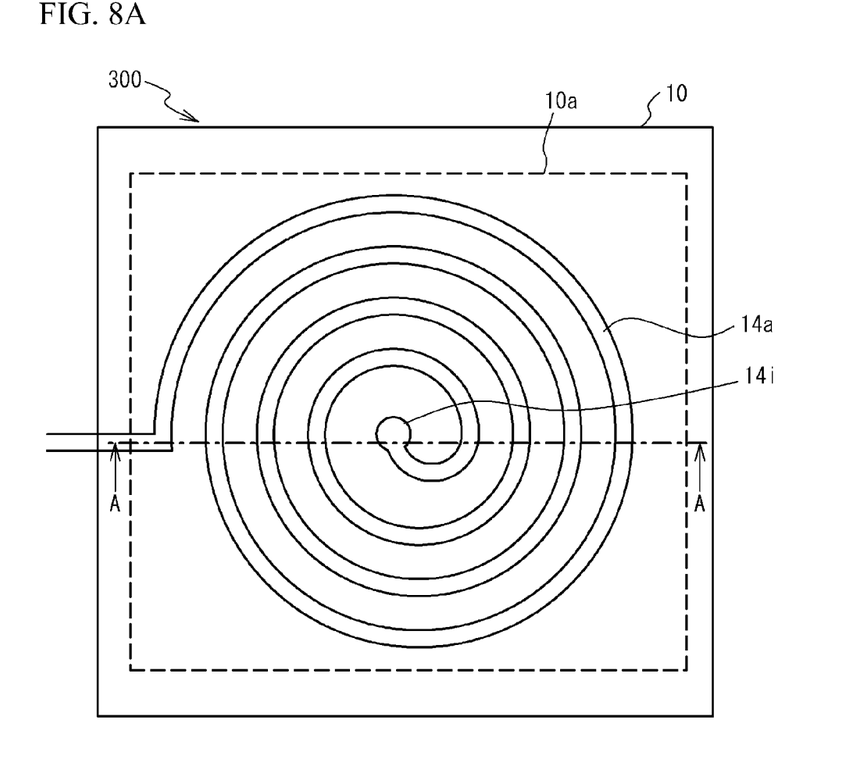
FIG. 8A is a plan view of a multilayer substrate configured in accordance with an embodiment 3.
Figure 8B:
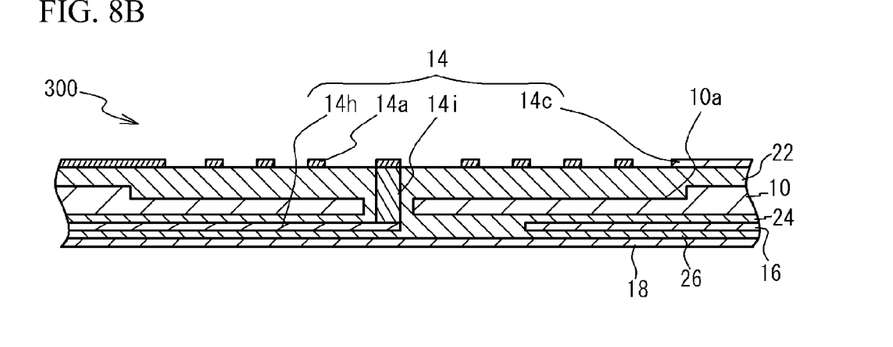
FIG. 8B is a cross-sectional view of the multilayer substrate of the embodiment 3.

A third embodiment has an exemplary multilayer substrate using a spiral inductor. FIG. 8A is a plan view of a multilayer substrate in accordance with the third embodiment, and FIG. 8B is a cross-sectional view taken along a line A-A. In FIG. 8A, the ends of the recess portion 10a are illustrated by broken lines.

Referring to FIGS. 8A and 8B, the signal line 14a of a multilayer substrate 300 is a spiral inductor, and the whole spiral inductor faces the recess portion 10a. A via interconnection 14i is connected to the center of the signal line 14a. The via interconnection 14i passes through an opening in the core 10 and interconnects the signal line 14a and a lead line 14h. The lead line 14h is located between the core 10 and the conductive layer 18.

According to the third embodiment, by changing the depth of the recess portion 10a and the thickness of the insulation layer 22, it is possible to adjust the inductance of the signal line 14a and obtain a desired inductance. For example, an increase in the distance between the signal line 14a and the core 10 increases the inductance value. As compared with a case where the signal line 14a is lengthened, the area occupied by the signal line 14a is small. The opening formed in the core 10 is as small as the via interconnection 14i passes through the core 10. It is thus possible to suppress the signal interference between the signal line 14a and the signal line in the conductive layer 16.

The signal line 14a and the lead line 14h may be at the same side of the core 10 (the upper side in FIG. 8A). However, a signal interference between the signal line 14a and the lead line 14h may occur. The signal line 14a and the lead line 14h may have portions that interfere with each other and portions that do not interfere with each other. This situation makes it difficult to adjust the inductance and the impedance. It is thus preferable that the lead line 14h is located at the side of the core 10 opposite to the side at which the signal line 14a is provided. This arrangement makes it possible to suppress the signal interference and to secure a sufficient distance between the lead line 14h and the core 10 and a sufficient distance between the lead line 14h and the conductive layer 18 and easily adjust the inductance and the impedance.

Embodiment 4

Figure 9A:
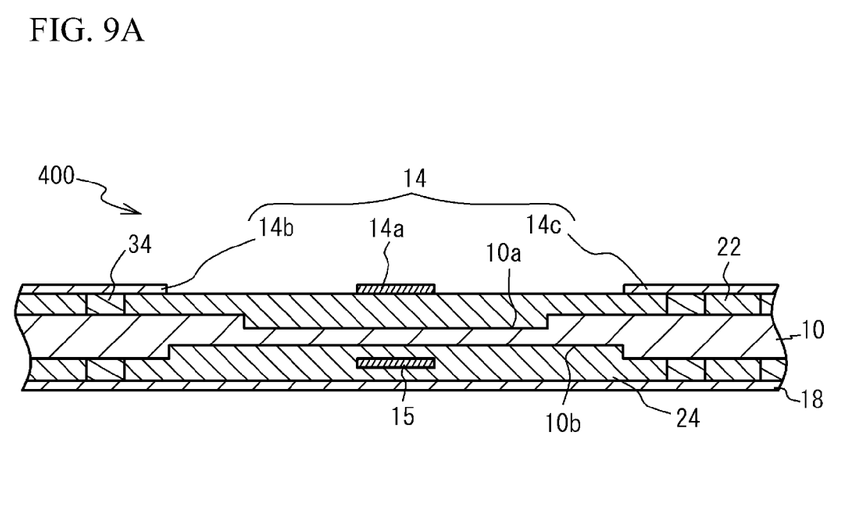
FIG. 9A is a cross-sectional view of a multilayer substrate in accordance with an embodiment 4.

An embodiment 4 is an exemplary multilayer substrate in which recess portions are formed on both sides of the core. FIG. 9A is a cross-sectional view of a multilayer substrate in accordance with the fourth embodiment.

Referring to FIG. 9A, the core of a multilayer substrate 400 has the recess portion 10a, and another recess portion 10b located on the side of the core opposite to the side thereof on which the recess portion 10a is located. The signal line 14a is provided so as to face the recess portion 10a, and a signal line 15 (third signal line) is provided so as to face the recess portion 10b. The signal line 15 is used to transmit the RF signal. The core 10 is connected to the ground layers 14b and 14c via the via interconnection 34 and to a ground layer included in the conductive layer 18. According to the fourth embodiment, it is possible to obtain desired characteristic impedances in the structure in which the signal lines are provided at both the sides of the core 10. Since the signal line 15 is located at the side of the core opposite to the side thereof at which the signal line 14a is provided, the signal interference between the signal line 14a and the signal line 15 can be suppressed.

Figure 9B:
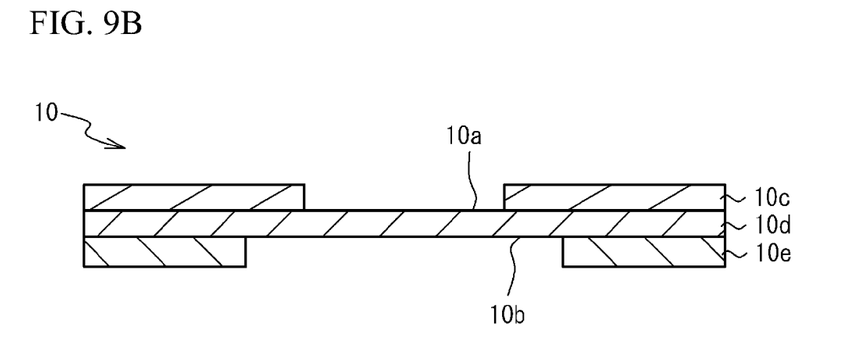
FIG. 9B is a cross-sectional view of a core used in the multilayer substrate of the embodiment 4.

FIG. 9B is a cross-sectional view of an exemplary structure of the core of the multilayer substrate in accordance with the embodiment 4. As illustrated in FIG. 9B, the core 10 includes a metal plate 10d, a metal plate 10c bonded to the upper surface of the metal plate 10d, and a metal plate 10e bonded to the lower surface of the metal plate 10d. An opening is formed in the metal plate 10c so as to expose the metal plate 10d. The recess portion 10a is defined by bonding the metal plates 10c and 10d. Similarly, the recess portion 10b is defined by bonding the metal plates 10d and 10e. The distances L3 and L4 illustrated in FIG. 2 can be adjusted by changing the lengths and widths of the openings. It is thus possible to adjust the characteristic impedances of the signal lines 14a and 15. The recess portions 10a and 10b may be formed by a half etching process of the core 10. The core 10 having only the recess portion 10a on the upper surface thereof employed in the embodiments 1~3 may be formed by bonding metal plates. The core 10 may not accommodate the electronic component 30.

The present invention is not limited to the specifically described embodiments, but other embodiments and variations may be made within the claimed invention.

What is claimed is:

1. A multilayer substrate configured by stacking conductive layers and insulation layers, the multilayer substrate comprising: a core that is one of the conductive layers and is thicker than any of other conductive layers, and the core serving as a ground layer; a first signal line that is included in the conductive layers and is adjacent to the core so that a first insulation layer that is one of the insulation layers is interposed between the core and the first signal line, and a first ground layer that is included in the conductive layers and is provided at a side of the first signal line opposite to another side of the first signal line at which the core is provided, wherein the core has a recess portion so as to face the first signal line, the first signal line and the recess portion extend in one of directions in which the multilayer substrate extends.

2. The multilayer substrate according to claim 1, wherein the core has a portion that accommodates at least part of an electronic component.

3. The multilayer substrate according to claim 1, wherein the first ground layer is adjacent to the first signal line so that a second insulation layer included in the insulation layers is interposed between the first ground layer and the first signal line.

4. The multilayer substrate according to claim 1, further comprising a second ground layer that is included in one of the conductive layers in which the first signal line is also included and is located at both sides of the first signal line.

5. The multilayer substrate according to claim 4, wherein a distance between the second ground layer and the first signal line is equal to or larger than a distance between an area defined by vertically projecting the first signal line onto the core in a stacking direction of the stacked conductive layers and insulation layers and a side surface of the recess portion.

6. The multilayer substrate according to claim 1, further comprising a second signal line that is included in the conductive layers and is provided at a side of the core opposite to another side thereof at which the first signal line is provided.

7. The multilayer substrate according to claim 1, further comprising:
a filter that filters an RF signal; and
an integrated circuit that amplifies the RF signal,
wherein a transmission line formed by the core and the first signal line interconnects the filter and the integrated circuit.

8. The multilayer substrate according to claim 1, further comprising duplexers receiving and outputting an RF signal, wherein a transmission line formed by the core and the first signal line is connected to the duplexers.

9. The multilayer substrate according to claim 1, wherein the first signal line is a spiral inductor.

10. The multilayer substrate according to claim 1, further comprising a third signal line that is provided at a side of a core opposite to another side thereof at which the first signal line is provided and is involved in transmission of an RF signal, wherein the core has another recess portion that faces the third signal line.

11. The multilayer substrate according to claim 1, wherein the core includes a first metal plate, and a second metal plate that has an opening and is bonded to the first metal plate.

12. A communication device comprising:
a multilayer substrate being configured by stacking conductive layers and insulation layers, the multilayer substrate including:
a core that is one of the conductive layers and is thicker than any of other conductive layers, and the core serving as a ground layer;
a first signal line that is included in the conductive layers and is adjacent to the core so that a first insulation layer that is one of the insulation layers is interposed between the core and the first signal line, and
a first ground layer that is included in the conductive layers and is provided at a side of the first signal line opposite to another side of the first signal line at which the core is provided,
wherein the core has a recess portion so as to face the first signal line, the first signal line and the recess portion extend in one of directions in which the multiplayer substrate extends and the first signal line is connected to at least one of an antenna, a duplexer and an integrated circuit.

13. The communication device according to claim 12, wherein the first signal line interconnects the duplexer and the integrated circuit.

14. The communication device according to claim 12, wherein the first signal line is used for transmission of an RF signal.

15. The communication device according to claim 12, wherein the core has a portion that accommodates at least part of the duplexer and the integrated circuit.

16. The communication device according to claim 12, wherein the first ground layer is adjacent to the first signal line so that a second insulation layer included in the insulation layers is interposed between the first ground layer and the first signal line.

17. The communication device according to claim 12, further comprising a second ground layer that is included in one of the conductive layers in which the first signal line is also included and is located at both sides of the first signal line.

18. The communication device according to claim 17, wherein a distance between the second ground layer and the first signal line is equal to or larger than a distance between an area defined by vertically projecting the first signal line onto the core in a stacking direction of the stacked conductive layers and insulation layers and a side surface of the recess portion.

19. The communication device according to claim 12, further comprising a second signal line that is included in the conductive layers and is provided at a side of the core opposite to another side thereof at which the first signal line is provided.

20. The communication device according to claim 12, wherein the first signal line is a spiral inductor.

21. The communication device according to claim 12, further comprising a third signal line that is provided at a side of a core opposite to another side thereof at which the first signal line is provided and is involved in transmission of an RF signal, wherein the core has another recess portion that faces the third signal line.

22. The communication device according to claim 12, wherein the core includes a first metal plate, and a second metal plate that has an opening and is bonded to the first metal plate.

* * * * *